United States Patent [19]

Whatley

[11] Patent Number: 4,573,020
[45] Date of Patent: Feb. 25, 1986

[54] FULLY DIFFERENTIAL OPERATIONAL AMPLIFIER WITH D.C. COMMON-MODE FEEDBACK

[75] Inventor: Roger A. Whatley, Austin, Tex.

[73] Assignee: Motorola, Inc., Schaumburg, Ill.

[21] Appl. No.: 682,873

[22] Filed: Dec. 18, 1984

[51] Int. Cl.[4] .......................... H03F 3/16; H03F 3/45
[52] U.S. Cl. .................................... 330/258; 330/253; 330/277
[58] Field of Search ............... 330/253, 257, 258, 259, 330/277

[56] References Cited

U.S. PATENT DOCUMENTS 4,371,843 2/1983 Fang et al. ..................... 330/258 X Primary Examiner—Eugene R. LaRoche
Assistant Examiner—Steven J. Mottola
Attorney, Agent, or Firm—Anthony J. Sarli, Jr.; Jeffrey Van Myers; Robert L. King

[57] ABSTRACT

An operational amplifier having differential inputs and differential outputs with a predetermined common-mode output voltage independent of common-mode input voltage and input voltage variation is provided. D.C. common-mode feedback is utilized to provide a differential amplifier having a precise common-mode output voltage.

5 Claims, 2 Drawing Figures

FULLY DIFFERENTIAL OPERATIONAL AMPLIFIER WITH D.C. COMMON-MODE FEEDBACK

TECHNICAL FIELD

This invention relates generally to amplifiers, and more particularly, to operational amplifiers having differential inputs and differential outputs.

BACKGROUND ART

A typical class of operational amplifiers is the class having a differential input and a single ended output. Ideally, the inputs may receive any D.C. common-mode voltage. However, realistically, the input voltage differential of an operational amplifier must be within the input common-mode voltage range. Since the output is single ended, the output voltage is always referenced with respect to a ground potential. However, a more general class of operational amplifiers is the class which has a differential input and a differential output. In certain integrated circuit signal processing applications, the class of fully differential operational amplifiers maximizes power supply rejection much more than the class of single ended output operational amplifiers. Again, the common-mode D.C input voltage may be any value within the input common-mode range. However, when differential outputs are present, the common-mode D.C. output voltage may be chosen to be any value within the output common-mode voltage range, independent of what the input common-mode voltage is. In order to maximize the dynamic range of the output voltage so that each signal can symmetrically vary as much as possible, the common mode D.C. output voltage commonly is at mid-supply. A disadvantage common to fully differential operational amplifiers is that such circuits are usually physically larger than single ended operational amplifiers and have a more complicated structure. Further, to effect a fully differential integrator requires two external integrating capacitors rather than one. A fully differential operational amplifier which uses common-mode feedback is described in "A Family of Differential NMOS Analog Circuits for a PCM Codec Filter Chip" by Senderowicz, Dreyer, Huggins, Rahim and Laber in the IEEE *Journal of Solid-State Circuits*, Volume SC-17, No. 6, December 1982, pages 1014–1023. A fully differential operational amplifier is described by Senderowicz et al. on page 1016. However, the operational amplifier utilizes switched capacitors requiring multiple clock signals to operate and a large amount of circuit area to implement.

BRIEF SUMMARY OF THE INVENTION

Accordingly, an object of the present invention is to provide an improved fully differential operational amplifier.

Another object of the present invention is to provide an improved fully differential operational amplifier which uses D.C. common-mode feedback.

Yet another object of the present invention is to provide an improved differential output operational amplifier having an output voltage with a maximized dynamic range.

In carrying out the above and other objects of the present invention, there is provided, in one form a fully differential operational amplifier generally comprising a current source for providing a constant source current. A first differential input stage is coupled to the current source and selectively receives a first input voltage and provides a first differential current in proportion thereto. A second differential input stage is also coupled to the current source and selectively receives a second input voltage and provides a second differential current in proportion thereto. First and second current sink means are coupled to the first and second differential input means, respectively, for sinking the first and second differential currents, respectively, in proportion to a reference current. First and second output means are coupled to the first and second current sink means, respectively. The first and second output means respectively provide first and second output voltages in proportion to the difference between the first and second differential currents. Common-mode feedback means are coupled to the first and second current sink means for providing the reference current in proportion to changes in the sum of the first and second output voltages relative to a reference voltage.

DETAILED DESCRIPTION OF THE INVENTION

Figure 1:
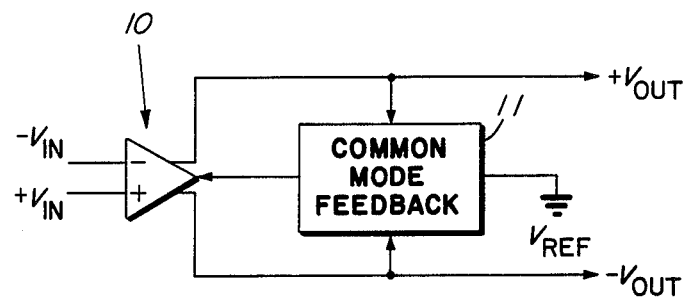
FIG. 1 illustrates in block diagram form a fully differential operational amplifier in accordance with the present invention.

Shown in FIG. 1 is a block diagram of a fully differential operational amplifier 10 illustrating the principal of the present invention. Differential amplifier 10 generally comprises first and second inputs and first and second outputs having voltage polarities as indicated. A common-mode feedback portion 11 has a first input coupled to the first output of differential amplifier 10, a second input coupled to the second output of differential amplifier 10, a third input coupled to a reference voltage and an output coupled to a control input of differential amplifier 10. The purpose of common-mode feedback portion 11 is to maintain the first and second output voltages at the reference voltage potential when a differential voltage is applied to the inputs of differential amplifier 10. Further, the output common-mode voltage of differential amplifier 10 will remain substantially the same and independent of variations in the input common-mode voltage. The first and second output voltages of differential amplifier 10 are proportional to the difference between first and second differential currents which are provided in response to first and second differential input voltages. The first and second differential currents are selectively sunk in proportion to a reference current which is provided by common-mode feedback portion 11. Common-mode feedback portion 11 provides the reference current in proportion to changes in the sum of the first and second output voltages relative to the reference voltage.

Figure 2:
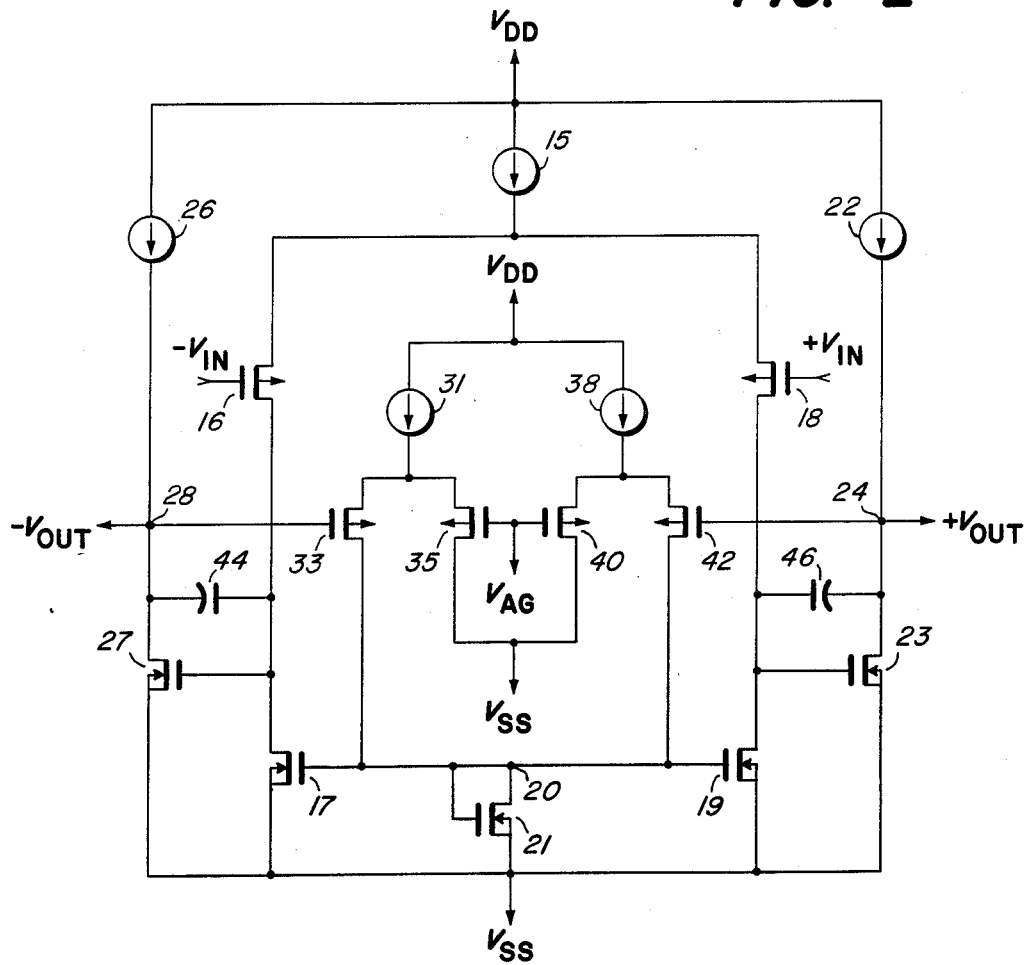
FIG. 2 illustrates in schematic form a fully differential operational amplifier in accordance with the present invention.

In particular, shown in FIG. 2 is a schematic diagram of a preferred embodiment of differential amplifier 10 and common mode feedback portion 11. A current source 15 has a first terminal connected to a power supply voltage, say $V_{DD}$, and a second terminal. A P-channel transistor 16 has a source connected to the second terminal of current source 15, a gate for receiving a first input voltage, labeled $-V_{IN}$, and a drain. An N-channel transistor 17 has a drain connected to the drain of transistor 16, a gate, and a source connected to a power supply terminal for receiving a second power supply voltage, say $V_{SS}$. A P-channel transistor 18 has a source connected to both the source of transistor 16 and the second terminal of current source 15. A gate of transistor 18 is connected to a second input voltage, labeled $+V_{IN}$ and a drain coupled to a drain of an N-channel transistor 19. A source of transistor 19 is connected to the power supply terminal for receiving $V_{SS}$, and a gate of transistor 19 is connected to the gate of transistor 17 at a node 20. An N-channel transistor 21 has both a gate and a drain connected to node 20 and a source connected to power supply voltage $V_{SS}$.

A first terminal of a current source 22 is connected to power supply $V_{DD}$ and a second terminal thereof is connected to a drain of an N-channel transistor 23 at a positive output terminal 24 labeled $+V_{OUT}$. A gate of transistor 23 is connected to both drains of transistors 18 and 19, and a source of transistor 23 is connected to power supply $V_{SS}$.

A current source 26 has a first terminal connected to power supply voltage $V_{DD}$ and a second terminal connected to a drain of an N-channel transistor at a negative output terminal 28 labeled $-V_{OUT}$. A gate of transistor 27 is connected to both drains of transistors 16 and 17, and a source of transistor 27 is connected to power supply voltage $V_{SS}$. In a preferred form, a substrate of each of transistors 17, 19, 21, 23 and 27 is connected to both the source therof and to $V_{SS}$.

A current source 31 has a first terminal connected to power supply voltage $V_{DD}$ and a second terminal. A P-channel transistor 33 has a source connected to the second terminal of current source 31, a gate connected to output terminal 28 and a drain connected to node 20. A P-channel transistor 35 has a source connected to the second terminal of current source 31, a gate connected to a terminal for receiving a reference voltage, say $V_{AG}$, and a drain connected to power supply voltage $V_{SS}$. A current source 38 has a first terminal connected to power supply voltage $V_{DD}$, and a second terminal a P-channel transistor 40 has a source connected to the second terminal of current source 38, a gate connected to the reference voltage terminal, and a drain connected to power supply voltage $V_{SS}$. A P-channel transistor 42 has a source connected to the second terminal of current source 38, a gate connected to output terminal 24, and a drain connected to node 20. For frequency stability purposes, a capacitor 44 has a first electrode connected to terminal 28 and a second electrode connected to the drain of transistor 16. A capacitor 46 having a first electrode connected to terminal 24 and a second electrode connected to the drain of transistor 18 is also provided for frequency stability purposes. For the purpose of illustration, power supply voltage $V_{DD}$ will be assumed to be more positive than power supply voltage $V_{SS}$, and reference voltage $V_{AG}$ will be assumed to have a value between $V_{DD}$ and $V_{SS}$. While specific N-channel and P-channel MOS devices are shown, it should be clear that the present invention may be implemented by completely reversing the processing techniques (e.g. P-channel to N-channel) or by using other types of transistors.

In operation, assume initially that the input voltages are equal so that there is no differential voltage and both output voltages should theoretically be at the output common-mode voltage. The common-mode output voltage is set by the reference voltage coupled to the gates of transistors 35 and 40 and is equal to $V_{AG}$. Assume, for the purpose of illustration only, that transistors 33, 35, 40 and 42 are linear devices which may be realistically achieved if the transistors are made to have large physical gate or channel lengths. Therefore, if differential input voltages are applied so that the current thru transistor 42 decreases by $\Delta I$, the current thru transistor 33 increases by $\Delta I$ while the net current flow thru transistor 21 remains substantially the same. In response thereto, the voltage at output terminal 24 increases by $\Delta V$ volts, and the voltage at output terminal 28 decreases by $\Delta V$ volts with the variation in voltage being centered substantially around $V_{AG}$. If transistors 33, 35, 40 and 42 are not linear, the output voltages at terminals 24 and 28 will not vary symmetrically about a predetermined output common-mode voltage resulting in a small common-mode voltage error which is added to the output voltages. However, if a plurality of stages is used with each stage having a differential amplifier such as the differential amplifier illustrated in FIG. 2, the additional common-mode voltage error will be cancelled in an immediately succeeding stage due to the use of differential inputs. Transistors 33 and 35 form a differential pair of transistors trying to conduct proportional currents. If transistors 33 and 35 are sized substantially the same, the currents conducted by both transistors will be the same and the voltage potential at the gate of transistor 33 will also be at $V_{AG}$. For example, assume that the input voltages remain equal so that the differential input voltage is zero and the common-mode output voltage varies so that the voltage at terminal 28 increases slightly. It is important to realize that the variation of the differential inputs may be independent of the variations in output common-mode voltage at terminals 24 and 28. An increase in voltage at terminal 28 causes transistor 33 to conduct less which decreases the voltage potential at the gate of transistor 17. As a result, transistor 17 conducts less current which causes the voltage potential at the gate of transistor 27 to increase. Transistor 27 begins to conduct more which lowers the voltage potential at terminal 28 making terminal 28 approach $V_{AG}$ again. The same circuit operation occurs for the differential pair of transistors 40 and 42 with respect to output terminal 24.

Similarly, assume that the input voltages again remain the same so that the differential is zero and the output common-mode voltage varies so that the output voltage at terminal 28 decreases. In response, transistor 33 begins to conduct less current. As a result, the bias voltage at the gate of transistor 17 will increase slightly making transistor 17 more conductive. Therefore, the gate voltage of transistor 27 decreases which causes transistor 27 to conduct less tending to make output terminal 28 rise back to the $V_{AG}$ voltage potential. The same circuit operation occurs with respect to the differential pair of transistors 40 and 42 as described above in relation to output terminal 24.

Upon application of a differential input voltage at the gates of transistors 16 and 18, the output common-mode voltage of differential amplifier 10 will still be equal to the reference voltage applied to the gates of transistors 35 and 40. Current source 15 functions as a constant current source for providing a constant current to the differential input pair of transistors 16 and 18. Transistors 16 and 18 provide first and second differential currents, respectively, to current sink transistors 17 and 19, respectively, in response to the input voltages. Current sink transistors 17 and 19 sink the first and second differential currents in proportion to a reference current which flows thru transistor 21. Transistor 21 functions as a current mirror input reference diode to mirror the reference current, or a portion thereof, to transistors 17 and 19. The reference current is the sum of the currents flowing thru transistors 33 and 42 and is proportional to changes in the sum of the output voltages at terminals 24 and 28 with respect to the reference voltage $V_{AG}$. Transistor 27 functions as an output device which provides the negative output voltage in proportion to the difference between the differential currents flowing thru transistors 16 and 18. Current source 26 is a bias current source which provides a bias current to transistor 27. Similarly, transistor 23 functions as a second output device which provides the positive output voltage in proportion to the difference between the differential currents flowing thru transistors 16 and 18. Current source 22 functions as a bias current source to provide a bias current to transistor 23.

By now it should be apparent that a fully differential operational amplifier has been provided which provides a common-mode output voltage which is independent of the input common-mode voltage and is substantially independent of the differential input voltage variation. The differential amplifier utilizes D.C. feedback by using transistors 33, 35, 40, 42 and 21 to provide a precise common-mode output voltage. The precise common-mode output voltage is obtained without the use of timing signals and is size efficient for integrated circuit purposes.

I claim:

1. A fully differential operational amplifier comprising:
   current source means for providing a constant source current;
   first differential input means coupled to the current source means, for selectively receiving a first input voltage and providing a first differential current in proportion thereto;
   second differential input means coupled to the current source means, for selectively receiving a second input voltage and providing a second differential current in proportion thereto;
   first current sink means coupled to the first differential input means, for sinking said first differential current in proportion to a reference current;
   second current sink means coupled to the second differential input means, for sinking said second differential current in proportion to the reference current;
   first output means coupled to the first current sink means, for providing a first output voltage at a first output terminal in proportion to the difference between the first and second differential currents;
   second output means coupled to the second current sink means, for providing a second output voltage at a second output terminal in proportion to the difference between the first and second differential currents; and
   common mode feedback means coupled to the first and second current sink means for providing the reference current in proportion to changes in the sum of the first and second output voltages relative to a reference voltage.

2. The fully differential operational amplifier of claim 1 further comprising:
   second current source means coupled to the first and second output terminals, for supplying current to said first and second output means.

3. A fully differential operational amplifier comprising:
   first current source means for providing a first constant current;
   first differential input means coupled to the first current source means, for selectively receiving a first input voltage and providing a first differential current in proportion thereto;
   second differential input means coupled to the first current source means, for selectively receiving a second input voltage and providing a second differential current in proportion thereto;
   first current sink means coupled to the first differential input means, for sinking said first differential current in proportion to a reference current;
   second current sink means coupled to the second differential input means, for sinking said second differential current in proportion to the reference current;
   first output means coupled to the first current sink means, for providing a first output voltage at a first output terminal in proportion to the difference between the first and second differential currents;
   second output means coupled to the second current sink means, for providing a second output voltage at a second output terminal in proportion to the difference between the first and second differential currents;
   a second current source for supplying a second constant current;
   a third current source for supplying a third constant current;
   a first transistor having a first current electrode coupled to the second current source, a control electrode connected to the first output terminal, and a second current electrode connected to the first current sink means;
   a second transistor having a first current electrode connected to the second current source, a control electrode connected to the reference voltage, and a second current electrode connected to a power supply terminal;
   a third transistor having a first current electrode connected to the third current source, a control electrode connected to the reference voltage, and a second current electrode connected to the power supply terminal;
   a fourth transistor having a first current electrode connected to the first current electrode of the third transistor, a control electrode connected to the second output terminal, and a second current electrode connected to the second current sink means, said first and fourth transistors providing the reference current; and
   current mirror means coupled between the second current electrode of the first and fourth transistors and the power supply terminal, for mirroring a predetermined portion of the reference current to the first and second current sink means.

4. A fully differential operational amplifier comprising:
   first, second and third current source means for providing first, second and third constant source currents;
   a first transistor coupled to the second current source means, for selectively receiving a first input voltage and providing a first current in proportion thereto;

a second transistor coupled to the second current source means, for selectively receiving a second input voltage and providing a second current in proportion thereto;

a third transistor having a current electrode coupled to the first transistor, and a control electrode, said third transistor sinking the first current in proportion to a third current;

a fourth transistor having a current electrode coupled to the second transistor, and a control electrode, said fourth transistor sinking the second current in proportion to the third current;

a fifth transistor having a control electrode coupled to the third transistor, a first current electrode connected to the first current source at a first output terminal, and a second current electrode connected to a power supply terminal, for providing a first output voltage in proportion to the difference between the first and second currents;

a sixth transistor having a control electrode coupled to the fourth transistor, a first current electrode connected to the third current source at a second output terminal, and a second current electrode connected to the power supply terminal, for providing a second output voltage in proportion to the difference between the first and second currents; and common mode feedback means coupled to the control electrodes of the third and fourth transistors, for providing the third current in proportion to changes in the sum of the first and second output voltages relative to a reference voltage.

5. The fully differential operational amplifier of claim 4 wherein said first and second transistors are of a first conductivity type and the third, fourth, fifth and sixth transistors are of a second conductivity type.

* * * * *